(12) United States Patent
Molyneaux et al.

(10) Patent No.: US 6,480,800 B1
(45) Date of Patent: Nov. 12, 2002

(54) METHOD AND SYSTEM FOR GENERATING SELF-TESTING AND RANDOM INPUT STIMULI FOR TESTING DIGITAL SYSTEMS

(75) Inventors: Robert F. Molyneaux, Lakeway, TX (US); Rajesh Raina, Austin, TX (US)

(73) Assignees: International Business Machines Corp., Armonk, NY (US); Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/246,896

(22) Filed: Feb. 8, 1999

(51) Int. Cl.[7] .............................................. G06F 19/00
(52) U.S. Cl. .......................... 702/120; 702/117; 716/4; 716/5
(58) Field of Search ................................. 702/117, 124, 702/57–59, 66, 70–74, 108, 126, 182–185, 186, 189, FOR 103, FOR 104, FOR 110, FOR 134, FOR 135, FOR 170, FOR 171; 716/5, 6, 1, 4; 703/13–16, 20; 714/738–742, 732, 735, 736, 718–720, 722, 723, 724, 728, 48, 49, 54, 57; 324/73.1, 765, 763; 365/201

(56) References Cited

U.S. PATENT DOCUMENTS 5,903,475 A * 5/1999 Gupte et al. ................. 714/735
6,134,684 A * 10/2000 Baumgartner et al. ...... 714/728
6,195,616 B1 * 2/2001 Reed et al. .................. 702/117

* cited by examiner

Primary Examiner—Hal Wachsman
(74) Attorney, Agent, or Firm—Leslie Van Leeuwen; Strasburger & Price, LLP

(57) ABSTRACT

The invention is a method and apparatus that verifies the design of electronic circuitry containing a function to be tested. An input, such as a random input, is provided to the electronic circuitry containing the function, yielding an output. This output, in turn, is used as input (denominated "inverse input") to an inverse of the function to be tested. The resulting output (termed "inverse output") is compared to the original input to the function to be tested to facilitate verification of the design of the circuitry.

25 Claims, 5 Drawing Sheets

METHOD AND SYSTEM FOR GENERATING SELF-TESTING AND RANDOM INPUT STIMULI FOR TESTING DIGITAL SYSTEMS

TECHNICAL FIELD

The present invention relates to the field of integrated circuit verification, and more specifically, to verifying the proper design and functionality of integrated circuits without using a "golden" model.

BACKGROUND OF THE INVENTION

The proliferation of modem electronics into our everyday life is due in large part to the existence, functionality and relatively low cost of advanced integrated circuits. As technology moves ahead, the sophistication of integrated circuits has increased dramatically. However, dramatic increases in chip performance and complexity have also driven the need for improved methodologies to thoroughly and cost-effectively test the circuits and functions within the chip 1 as much as 30% to 50% of the total design effort. Designers recognize that faulty design verification can lead to expensive mask revisions and missed time-to-market deadlines.

When the industry was in its infancy, semiconductor designers relied primarily upon manually-generated test sequences for design verification. Test engineers selected functions to test and wrote test programs that provided pre-defined input stimuli to the function and compared the result with a precomputed expected response. This test methodology was slow and highly limited in that not every machine-state that the function may be exposed to during normal operation could be tested. Moreover, developing the test programs took a significant amount of time. Manually-generated tests are generally thought to be too hard to develop and too limited to be used as a primary design verification tool for today's complex chip designs. Nevertheless, manually generated tests are still useful for very limited design verification, built-in-self-testing, and quality assurance testing in the manufacturing process.

Today's chip designers employ a variety of different functional verification methodologies throughout the design process to insure that the design is on-track, including simulation, emulation, test generation, formal verification, and ASIC prototyping. These design verification methodologies have their advantages and disadvantages, but all share a common drawback—they require a "golden model." A golden model is a working model or software simulation of the system being designed that, when provided with an input, produces a known-correct output. Since the golden model is (by definition) known to function in accordance with the chip's design parameters, the output of the golden model is assumed to be correct. Designs are tested by providing identical inputs to the system under test and the golden model. If the output of the circuit or system under test is different from the output of the golden model when the circuit or system under test and the golden model are provided with the same input, system designers conclude that there is an error in the system under test that must be identified and corrected.

Although the use of a golden model as a verification tool is becoming more common in the industry, golden model-based verification is far from ideal. Developing an accurate golden model is expensive, time-consuming, and ties up valuable design resources. Golden models that are developed early enough in the design process to be useful for presilicon verification must be continually maintained and updated as the design evolves and as design verification progresses. If the golden model is developed using a commercially-available proprietary simulation language tool set (such as Verilog or VHDL), chip designers may gain the portability and interface advantages typically associated with an industry-standard tool, but may also incur high licensing fees and learning curve costs and delays. Golden models are typically orders of magnitude slower than the chips that they simulate, and therefore running simulations on the golden model consumes considerable time and computing resources. Finally, designers must always face the risk that their golden model contains unidentified errors that skew test results. Even error-free golden models may exhibit subtle, but ultimately important, behaviors that are different from the final chip design.

The present invention comprises a functional verification apparatus and methodology that enables rigorous random input-based design verification without the use of a golden model, thus providing chip designers all the advantages of random input-based design verification without the significant disadvantages associated with golden models.

SUMMARY OF THE INVENTION

The present invention is a method and apparatus that verifies the design and functionality of electronic circuitry without the use of a golden model. The designer tests circuitry that comprises a specified function by providing test input variables to the circuit under test, and inverse input variables to the circuitry comprising the inverse of the function under test. Depending upon the specific function under test, the input variables and inverse input variables may be randomly—generated numerical values, or they may be variables or instructions selected to yield a specific result as compared to the expected result of the circuitry under test. The present invention exercises both the circuitry under test and the circuitry that is the inverse of the circuitry under test, collects and compares results, and provides an error notification when the comparison does not yield an expected result. If a designer receives an error notification, he is alerted to the possibility of an error condition in either the circuitry under test or in the inverse of the circuitry under test.

BRIEF DESCRIPTION OF THE DRAWINGS

To further aid in understanding the invention, the attached drawings help illustrate specific features of the invention and the following is a brief description of the attached drawings.

BRIEF DESCRIPTION OF THE PREFERRED EMBODIMENT

Figure 1:
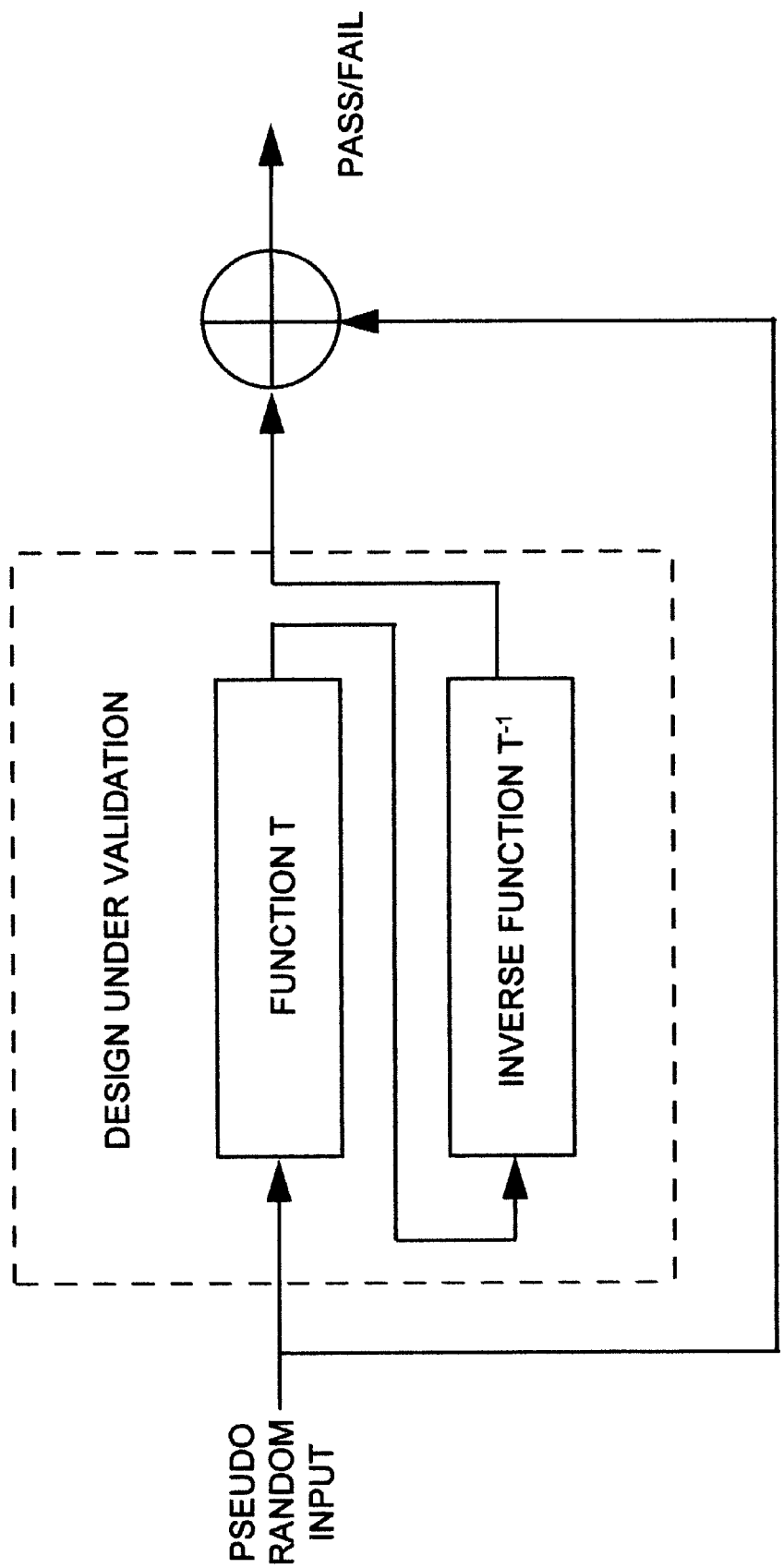
FIG. 1 illustrates the random self-test principle of the present invention.

The present invention comprises a method and apparatus that verifies the design and functionality of electronic circuitry, without the need for a golden reference model or simulator. This disclosure describes numerous specific details that include specific test methodologies, circuits, and logic functions in order to provide a thorough understanding of the present invention. One skilled in the art will appreciate that one may practice the present invention without these specific details. In addition, while this disclosure focuses on the application of the present invention to the verification of semiconductor and circuitry design, one skilled in the art will recognize that the present invention can be also be applied in the context of built-in-self-test using random input stimuli, and in the context of quality assurance testing to identify manufacturing defects.

Semiconductor technology has advanced to the point where rigorous design verification and manufacturing testing have become essential steps in the development and production processes. The industry is generally moving away from primary reliance upon sharply-focused, manually-generated test routines that provide predetermined input stimuli to targeted portions of a chip and look for an expected response. Instead, manufacturers are embracing testing and verification techniques that employ automatically-generated pseudo-random input stimuli, provided either sequentially, to every test point in a chip, to randomly selected test points, or to specified test points selected to test specific functions (directed random testing). Random-input testing is considered to more rigorously test a design for a number of reasons, but primarily because of the sheer volume of tests that can be run (as compared to manually-generated test routines with specified inputs). However, in the past, random-input testing could only be accomplished by providing a randomly-selected test input to both the system under test and to a golden model—a known good system or model—and comparing the outputs of both. Although random input testing with a golden model is considered a rigorous test regime that ultimately results in a robust design, the need for a golden model and the problems associated with golden models—some of which are discussed briefly above—have presented a major drawback to random input stimuli testing and verification.

The present invention discloses a method and apparatus by which random stimuli can be applied to parts fulfilling certain conditions, where the response is self-tested without a golden model. The present invention rests upon the following basic principle, denoted herein as the "random self-test principle:"

If $$y=T(x)$$

and $$x'=T^{-1}(y)$$

then if x≠x', then either module T or module $T^{-1}$ is malfunctional.

Where:

T represents the functionality of the module being tested (e.g., add);

$T^{-1}$ represents the inverse of the functionality of the module being tested (e.g., subtract);

x represents a random input stimulus;

y represents the result or output of T with input stimulus x; and x' represents the result of $T^{-1}$ with inverse input stimulus y (i.e., the output of function T serves as the input of function $T^{-1}$).

The random self-test principle is illustrated in FIG. 1. This technique can only be applied to designs that contain both a functions and its inverse. However, due to the balanced and iterative nature of most processor designs, almost every function has an inverse. In other words, there is almost always an undo for every function. For example, the inverse of the add function is subtract. The inverse of shift-left is shift-right. The inverse of load-word is store-word. In the case of multimedia chips, the function compress is accompanied by its inverse, uncompress, and the function buffer is accompanied by debuffer. As discussed in more detail below, functions that do not have an obvious inverse often have inverses that can be indirectly created from other functions.

The following test sequence illustrates the application of the random self-test principle in its most basic form. In this sequence, the principle is applied to verify circuitry comprising an add function. In this sequence, the function, T, is addq, and its inverse, $T^{-1}$, is subq.

| | | |
|---|---|---|
| lda | r2, const(r31) | load into register r2 operand B, which is a constant |
| get_rv | r1 | fetch operand A, a random variable, and load into register r1 |
| addq | r1, r2, r3 | add A + B and place the result into register r3 |
| stq | r3, 0(r4) | store the result of A + B in main memory register r4 |
| ldq | r3, 0(r4) | load the result of A + B from main memory register r4 to r3 |
| get_rv | r1 | fetch operand A from register r1 |
| subq | r3, r1, r6 | subtract operand A from result of A + B, place result into register r6 |
| xor | r6, r2, r7 | compare actual result of subtract operation (r6) with expected result of subtract operation (r2) and place comparison result in r7 |
| bne | r7, error | branch on error |

In this basic test sequence, a random variable, A, is added to a constant, B, to achieve a result. The same random variable is then subtracted from the result obtained by the add operation, and that result is checked for errors. If the result of the subtract operation is anything but the constant B, the designer is alerted to a possible error within the circuitry comprising either the add or the subtract functions.

Figure 2:
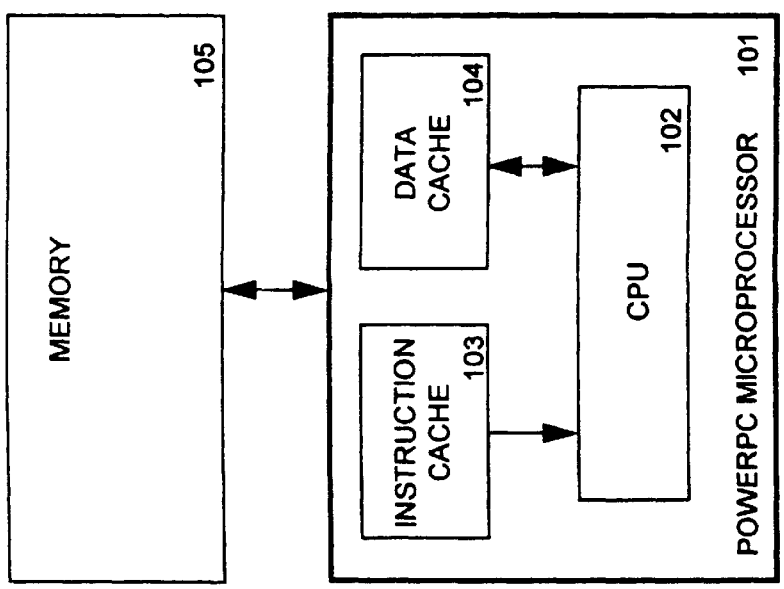
FIG. 2 shows a conceptual view of the on-chip cache organization in the PowerPC™ 604e microprocessor.
Figure 3:
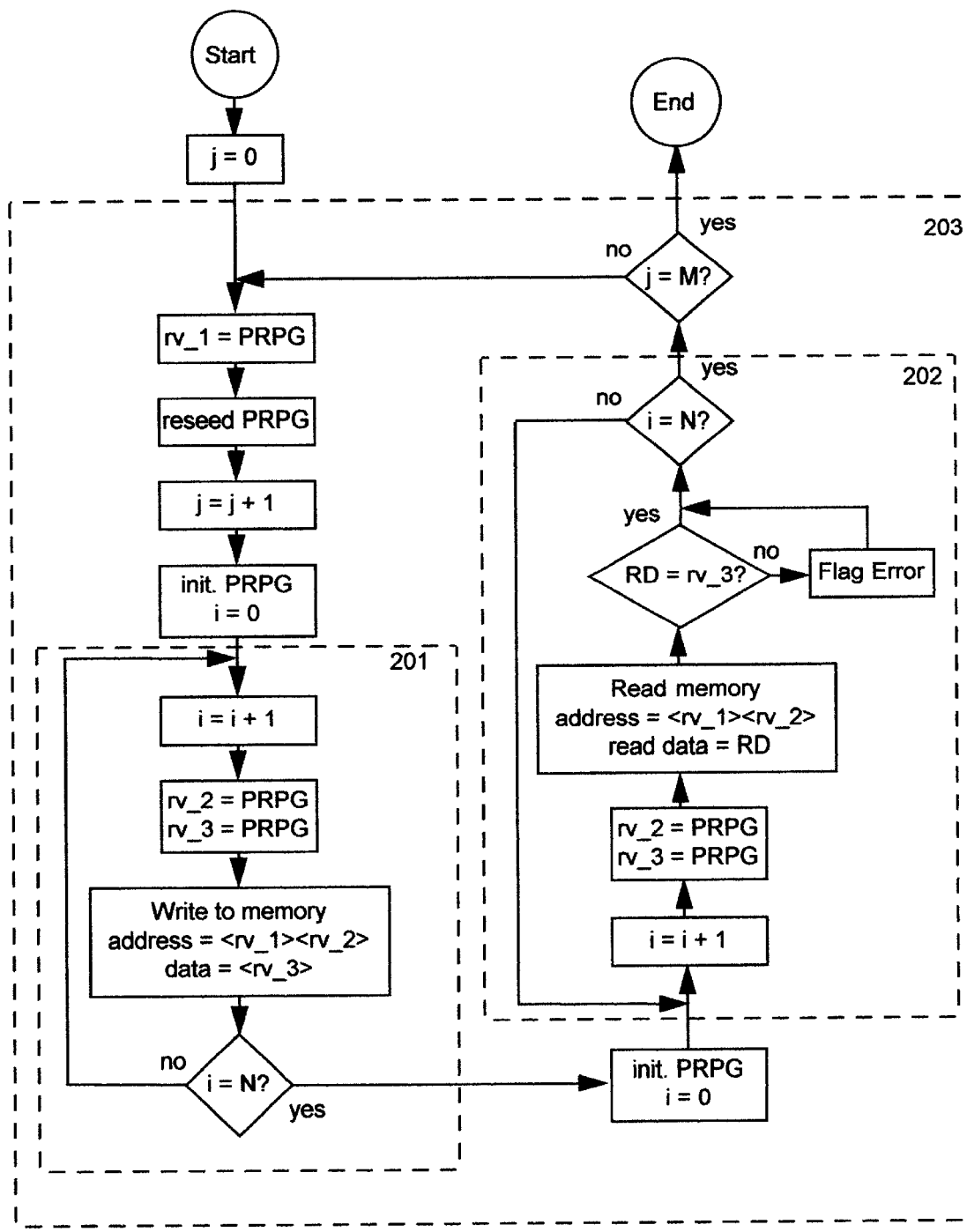
FIG. 3 depicts the functional flow of a test template that tests the major functions of a data cache within a microprocessor according to one embodiment of the present invention.

The test sequence shown in FIG. 3 illustrates the use of the present invention in the context of testing an internal data cache within a microprocessor, such as the data cache found in the PowerPC™ Microprocessor family ("PowerPC" is a trademark of IBM Corporation). FIG. 2 shows a conceptual view of the on-chip cache organization in the PowerPC™ 604e microprocessor, according to "The PowerPC™ Architecture: A Specification for a New Family of RISC Processors," 2d edition, 1994, Cathy May, et. al., which is incorporated herein by reference. A more specific implementation of a PowerPC™ microprocessor is described in the "PowerPC™ 604 RISC Microprocessor User's Manual," 1994, by IBM Corporation, which is incorporated herein by reference. In FIG. 2, the microprocessor 101 includes a CPU 102, a read-only instruction cache 103, and a data cache 104. The microprocessor interfaces with main memory 105. In this example, the data cache 104 is an 8-way set associative write-through data cache, which means that the CPU 102 writes to both the data cache 104 and the main memory 105.

The four major functional operations of the data cache 104 are: Cache Load, Address Tag Compare (Hit/Miss), Victim Allocate/Castout, and Write Allocate. For the purposes of this disclosure, these functions are designated as operational functions. These operational functions can be combined such that one or more of the functions becomes the inverse, or complement, of another. For example, in a properly functioning data cache, the write allocate and cache load functions operate to select cache locations to write to, and to load the incoming data to the selected location. On the other hand, the victim allocate/castout function operates to select data to delete from the cache to make room for incoming data, deletes the data, and loads it into the main memory. The victim allocate/castout function is not truly the inverse of the write allocate and cache load functions, because a specified victim allocate/castout function does not truly "undo" a specified write allocate and cache load, in the same sense that a specified subtract "undoes" a specified addition. However, for the purposes of this disclosure, the victim allocate/castout function can be considered a complimentary function of the write allocate and cache load functions, because these functions can be asserted in a test sequence to obtain a specific result that verifies that each function is operating properly.

FIG. 3 shows a flow chart of a test sequence that exercises the write allocate and cache load functions, and their inverse or complement, the victim allocate/castout function. In this example, a Pseudo-Random Pattern Generator (PRPG) is used as a source for the random stimulus. Random data is written to and cast out of random cache addresses that consist of an index and a tag.

In the first inner loop 201, random data is written to addresses with random tags and a fixed index. Since the cache supports write allocate and is 8-way set associative, all 8 ways of a particular index will quickly fill up. The first inner loop 201 repeats N times, such that after the Nth iteration, a total of N tag-random addresses will be initialized with random data. If the value of N is 9 or greater, the last 8 addresses will reside in the data cache 104 and the remainder of the addresses will reside in the main memory 105. The first inner loop 201 thus exercises the write allocate and the victim allocate/castout functions.

Before the second inner loop 202 initiates, the PRPG is reinitialized such that inner loop 202 reads back the same N tag-random memory locations and compares the data stored at those memory locations (rv_3 in the first inner loop 201) with the value expected to be there (rv_3 in the second inner loop 202). If the data values are not the same, the test program signals that an error has been encountered, warning the chip designer of a possible error in either the write allocate, victim allocate/castout, or cache load functions. The second inner loop 202 thus exercises the cache load, victim allocate/castout, and tag compare functions.

The outer loop 203 repeats the testing performed by the inner loops 201 and 202 on M random index values (rv_1), complementing the tag-compare testing performed by the inner loops 201 and 202. The entire sequence thus thoroughly tests the write allocate, cache load, and tag compare functions by allocating, writing, loading, and comparing randomly generated data values to M×N randomly selected addresses. Similarly, the sequence thoroughly tests the victim allocate/castout function by selecting M×(N−8) randomly generated data values, removing those values from the data cache 104, and storing them in main memory 105.

One skilled in the art will recognize that chip designers practicing the present invention could develop test templates similar to that shown in FIG. 3 to exercise all functions of the cache, varying addressing, read/write sequencing, cache on/off testing, and data-width granularity. Additionally, a practical validation/test environment would also insert background activity such as external interrupts and direct memory access requests to rigorously test the cache design, in a fashion similar to directed random testing.

Note that the example test sequence described in FIG. 3 will not produce an error notification if the data cache is completely nonfunctional (i.e., the CPU gets a cache miss all the time and all read/write operations access main memory). Such a gross design error is highly unlikely, but the possibility of such an error could be easily eliminated with a short, manually written test sequence verifying that the cache is at least partially functional. These types of manually-generated tests are simple to write and complement the ability of the present invention to verify design functionality for an enormous number of potentially obscure machine-states.

Figure 4B:
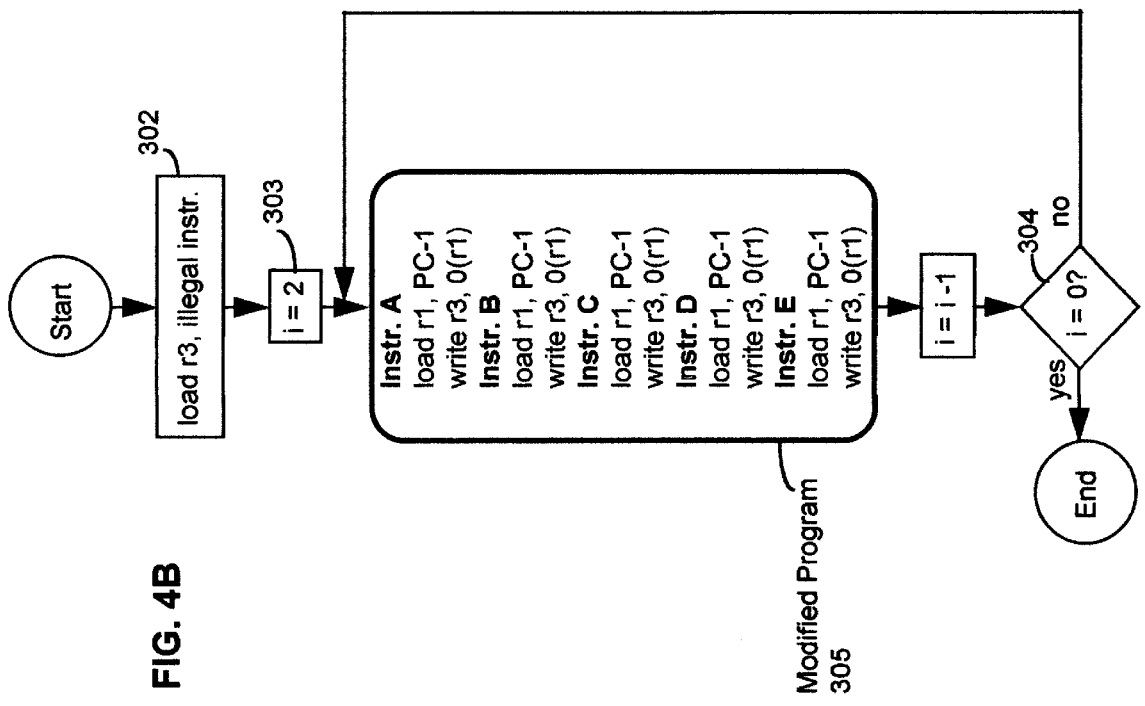
FIGS. 4A and 4B depict an example original program, and the functional flow of a test template developed from that original program that tests the major functions of an instruction cache within a microprocessor according to one embodiment of the present invention.

FIG. 4B shows a third example of the random self-test principle, applied in a directed random test scenario, to test a read-only instruction cache 103 within a processor. The "instruction cache thrasher" shown in FIG. 4B is slightly different from the add test sequence and the data cache test sequence described above because application of the present invention in this directed random context does not necessarily require the generation and use of random input variables and inverse input variables.

The major functions of the read-only instruction cache 103 are cache load, address tag compare (hit or miss), and victim allocate/castout. These functions can be tested by initializing register r3 with an illegal instruction, and appending the following two instructions after each instruction of any existing program:

load r1, PC-1 ; load register r1 with the address of the previous instruction write r3, 0(r1); write the illegal instruction in r3 to the main memory address in r1.

Figure 4A:
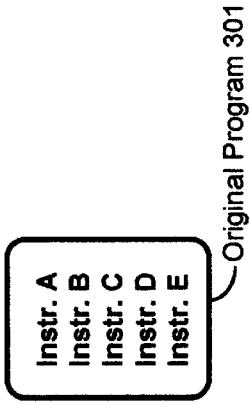

FIG. 4A shows a program 301 (designated "Original Program") that can be any existing program or a randomly generated program. Referring to FIG. 4B, register r3 is first initialized with an illegal instruction at block 302, and a loop counter is set at block 303 to cause the test loop to run twice. The test loop itself comprises the original program 301, modified by inserting the above two instructions after every original program instruction (designated the "Modified Program" 305 in FIG. 4B). The first time through the loop, if the load cache function of the instruction cache is operating properly, each instruction of the original program will be loaded into the instruction cache as it is encountered and executed. After each original program instruction is encountered, executed, and loaded into the instruction cache, the next two instructions then overwrite the original program instruction at its original main memory address with the illegal instruction that was pre-loaded into r3. By the time the first loop completes at 304, all cache-resident original program instructions should have an illegal instruction in the corresponding main-memory location.

On the second loop through the program, if the instruction cache is working properly, each original instruction will be executed properly because the original program instructions are resident in the instruction cache. On the other hand, if all the original instructions did not load properly the first time through, the tag compare function will indicate a miss and the processor will attempt to execute the illegal instruction from main memory.

This template could be re-run with enough appended original program instructions to fill up the instruction cache and activate the victim allocate/castout function before the first loop completes. Under this scenario, if the victim allocate/castout function is working properly, only the most recently executed original program instructions will be resident in the instruction cache, while the oldest original program instructions will have been deleted from the instruction cache and re-written to main memory, overwriting the illegal instruction written at the original instruction address the first time through the loop. Therefore, if all the functions in the instruction cache are working properly, the original program will execute on the second time though the loop. When the program calls for instructions that have been deleted from the instruction cache by the victim allocate/castout function, the tag compare function will indicate a miss and the instruction will be found at the proper location in main memory, because the victim allocate/castout function should have overwritten the illegal instruction. On the other hand, if the processer attempts to execute the illegal instruction at any time during the second time through the loop, the designer is alerted to a possible error in one of the instruction cache functions.

This test template is thus capable of validating all the major instruction cache functions such as cache load, victim allocate, and tag compare.

In practice, the instruction cache thrasher could be written to restructure the modified program to improve efficiency, scope, and diagnostic ability. For example, register r3 could be initialized with the opcode of a write instruction, instead of an illegal instruction as described in this example. The write instruction could provide unique information that would simplify diagnosis of failed functions or cache locations. Alternately, the illegal instruction exception handler can be rewritten to process every failed function/location before returning execution to the test program.

Testing a microprocessor, microcontroller, or multimedia chip by applying the present invention to the chip-resident functions and their inverses, in accordance with the examples described in this disclosure, allows chip designers to run tests on real hardware without the need for an on-the-fly reference model or a pre-computed expected response. The random self-test principle provides designers with a verification tool that has the advantages of built-in-self-testing (e.g., speed) and random input verification (e.g., robustness), but does not require extensive manual test program generation or development and maintenance of a golden model. Moreover, using the present invention, comprehensive random-input verification tests can be conducted without the protracted simulation time and considerable computing resources required in the past. For example, the instruction and data caches of a microprocessor can be fully tested using the present invention by applying ten to twelve test templates similar in complexity to those shown in FIGS. 3 and 4. Ten seconds of random self-testing based upon these principles yields three billion test cycles on a 300 MHZ microprocessor.

Figure 5:
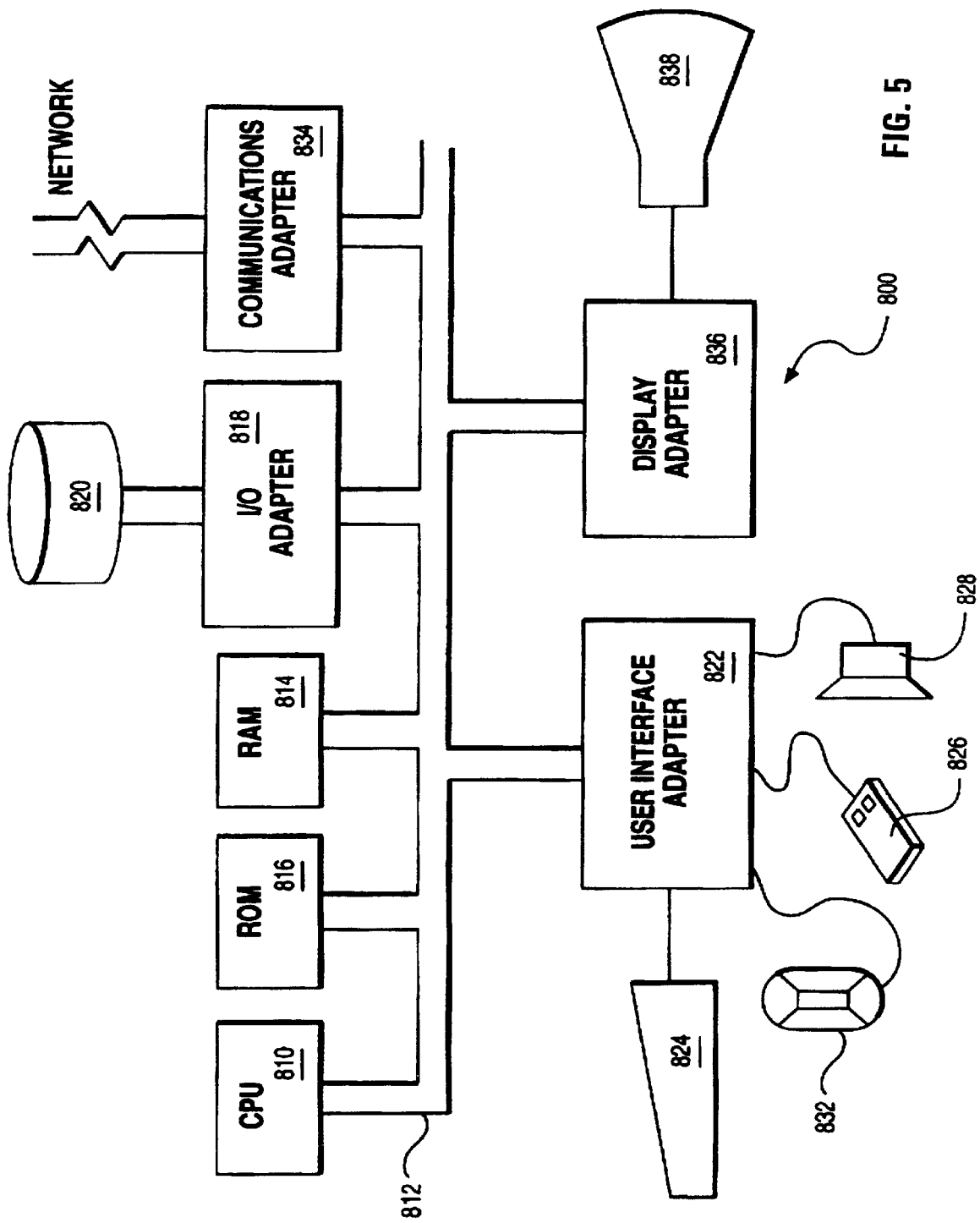
FIG. 5 illustrates a system used to practice the present invention.

FIG. 5 illustrates a data processing system 800 that could be used to practice the present invention. The system has a central processing unit (CPU) 810, such as a PowerPC™ microprocessor. The CPU 810 is coupled to various other components by system bus 812. Read only memory ("ROM") 816 is coupled to the system bus 812 and includes a basic input/output system ("BIOS") that controls certain basic functions of the data processing system 800. Random access memory ("RAM") 814, I/O adapter 818, and communications adapter 834 are also coupled to the system bus 812. I/O adapter 818 may be a small computer system interface ("SCSI") adapter that communicates with a disk storage device 820. Communications adapter 834 interconnects bus 812 with an outside network enabling the data processing system to communicate with other data processing systems or with a circuit or system under test. Input/Output devices are also connected to the system bus 812 via user interface adapter 822 and display adapter 836. Keyboard 824, track ball 832, mouse 826, and speaker 828 are all interconnected to bus 812 via user interface adapter 822, and display monitor 838 is connected to system bus 812 by display adapter 836, so that input is communicated to the system through the keyboard 824, trackball 832, or mouse 826, and output from the system is communicated via speaker 828 and display 838. Additionally, an operating system such as AIX™ ("AIX" is a trademark of the IBM Corporation) is used to coordinate the functions of the various components shown in FIG. 5.

Preferred implementations of the invention include implementations as a computer system programmed to execute the method or methods described herein, and as a computer program product. According to the computer system implementation, data, including sets of instructions for executing the method or methods, are resident in the RAM 814 of one or more computer systems configured generally as described above. Until required by a computer system, the set of instructions may be stored as a computer program product in another computer memory, for example, in disk drive 820 (which may include a removable memory such as an optical disk or floppy disk for eventual use in the disk drive 820). The computer program product can also be stored at another computer and transmitted when desired to the user's work station by a network or by an external network such as the Internet. One skilled in the art will appreciate that the physical storage of the sets of instructions physically changes the medium upon which it is stored so that the medium carries computer readable information. The change may be electrical, magnetic, chemical, or some other physical change. While it is convenient to describe the invention in terms of instructions, symbols, characters, or the like, the reader should remember that all of these and similar terms should be associated with the appropriate physical elements.

In sum, the present invention is a method and apparatus that verifies the design and functionality of electronic circuitry without the use of a golden model. The designer tests circuitry that comprises a specified function by providing test input variables to the circuit under test, and inverse input variables to the circuitry comprising the inverse or complement of the function under test. Depending upon the specific function under test, the input variables and inverse input variables may be randomly-generated variables, or they may be variables or instructions selected to yield a specific result as compared to the expected result of the circuitry under test. The present invention exercises both the circuitry under test and the circuitry that is the inverse or complement of the circuitry under test, collects and compares results, and provides an error notification when the comparison does not yield an expected result. If a designer receives an error notification, he is alerted to the possibility of an error condition in either the circuitry under test or in the inverse of the circuitry under test.

Other embodiments of the invention will be apparent to those skilled in the art after considering this specification or practicing the disclosed invention. The specification and examples above are exemplary only, with the true scope of the invention being indicated by the following claims.

We claim the following invention:

1. A test method that verifies the design and functionality of electronic circuitry, said electronic circuitry comprising a function to be tested, said test method comprising:

providing an input to the electronic circuitry, wherein the function to be tested generates an output corresponding to said input;

providing an inverse input to the inverse of the function to be tested, said inverse input comprising the output, wherein the inverse of the function to be tested generates an inverse output corresponding to said inverse input; and generating an error notification when comparison of said inverse output of the inverse of the function to be tested and said input does not yield an expected result.

2. The method of claim 1 wherein said input to the function to be tested further comprises a pseudo-random numerical value.

3. The method of claim 2 wherein the function to be tested comprises an arithmetic function, the inverse of the function to be tested comprises the inverse arithmetic function, said output of the function to be tested comprises the arithmetic combination of said input and a constant, said inverse output of the inverse of the function to be tested comprises the inverse arithmetic combination of said output of the function to be tested and said input, and said expected result comprises said constant.

4. The method of claim 2, wherein the function to be tested comprises one or more operational functions, the inverse of the function to be tested comprises one or more complementary operational functions that operate with the function to be tested, and said input to the function to be tested and said inverse input to the inverse of the function to be tested each comprise an identical plurality of pseudo-random numerical values.

5. The method of claim 1, wherein the function to be tested comprises one or more operational functions, the inverse of the function to be tested comprises one or more complementary operational functions that operate with the function to be tested, and said input to the function to be tested and said inverse input to the inverse of the function to be tested each comprise a plurality of instructions.

6. A method of verifying the design and functionality of electronic circuitry, said electronic circuitry comprising a function to be tested, said method comprising:

generating one or more inputs to the function to be tested and stimulating the electronic circuitry comprising the function to be tested, wherein the function to be tested generates an output corresponding to said one or more inputs;

generating one or more inverse inputs to the inverse of the function to be tested, said inverse inputs comprising the output, and stimulating electronic circuitry comprising the inverse of the function to be tested, wherein the inverse of the function to be tested generates an inverse output corresponding to said one or more inverse inputs; and generating an error notification when comparison of said inverse output of the inverse of the function to be tested and said input does not yield an expected result.

7. The method of claim 6 wherein said one or more inputs to the function to be tested further comprises a pseudo-random numerical value.

8. The method of claim 7 wherein the function to be tested comprises an arithmetic function, the inverse of the function to be tested comprises an inverse arithmetic function, said output of the function to be tested comprises the arithmetic combination of said one or more inputs and a constant, said output of the inverse of the function to be tested comprises the inverse arithmetic combination of said output of the function to be tested and said input, and said expected result comprises said constant.

9. The method of claim 7 wherein the function to be tested comprises one or more operational functions, the inverse of the function to be tested comprises one or more complementary operational functions that operate with the function to be tested, and said one or more inputs to the function to be tested and said one or more inverse inputs to the inverse of the function to be tested each comprise an identical plurality of pseudo-random numerical values.

10. The method of claim 6, wherein the function to be tested comprises one or more operational functions, the inverse of the function to be tested comprises one or more complementary operational functions that operate with the function to be tested, and said one or more inputs to the function to be tested and said one or more inverse inputs to the function to be tested each comprise a plurality of instructions.

11. A test apparatus that verifies the design and functionality of electronic circuitry, said electronic circuitry comprising a function to be tested, said test apparatus comprising:

an input to the electronic circuitry, wherein the function to be tested generates an output corresponding to said input;

an inverse input to the inverse of the function to be tested, said inverse input comprising the output, wherein the inverse of the function to be tested generates an inverse output corresponding to said inverse input; and an error notification when comparison of said inverse output of the inverse of the function to be tested and said input does not yield an expected result.

12. The test apparatus of claim 11 wherein said input to the function to be tested further comprises a pseudo-random numerical value.

13. The test apparatus of claim 12 wherein the function to be tested comprises an arithmetic function, the inverse of the function to be tested comprises an inverse arithmetic function, said output of the function to be tested comprises the arithmetic combination of said input and a constant, said inverse output of the inverse of the function to be tested comprises the inverse arithmetic combination of said output of the function to be tested and said input, and said expected result comprises said constant.

14. The test apparatus of claim 12, wherein the function to be tested comprises one or more operational functions, the inverse of the function to be tested comprises one or more complementary operational functions that operate with the function to be tested, and said input to the function to be testes and said inverse input to the inverse of the function to be tested each comprise an identical plurality of pseudo-random numerical values.

15. The test apparatus of claim 11, wherein the function to be tested comprises one or more operational functions, the inverse of the function to be tested comprises one or more complementary operational functions that operate with the function to be tested, and said input to the function to be tested and said inverse input to the inverse of the function to be tested each comprise a plurality of instructions.

16. A system that verifies the design and functionality of electronic circuitry, said electronic circuitry comprising a function to be tested, said system comprising:

an input to the electronic circuitry, wherein the function to be tested generates an output when stimulated by said input;

an inverse input to the inverse of the function to be tested, said inverse input comprising the output, wherein the inverse of the function to be tested generates an inverse output when stimulated by said inverse input; and an error notification when comparison of said inverse output of the inverse of the function to be tested and said input does not yield an expected result.

17. The system of claim 16 wherein said input to the function to be tested further comprises a pseudo-random numerical value.

18. The system of claim 17 wherein the function to be tested comprises an arithmetic function, the inverse of the function to be tested comprises an inverse arithmetic function, said output of the function to be tested comprises the arithmetic combination of said input and a constant, said inverse output of the inverse of the function to be tested comprises the inverse arithmetic combination of said output of the function to be tested and said input, and said expected result comprises said constant.

19. The system of claim 17, wherein the function to be tested comprises one or more operational functions, the inverse of the function to be tested comprises one or more complementary operational functions that operate with the function to be tested, and said input to the function to be tested and said inverse input to the inverse of the function to be tested each comprise an identical plurality of pseudo-random numerical values.

20. The system of claim 16, wherein the function to be tested comprises one or more operational functions, the inverse of the function to be tested comprises one or more complementary operational functions that operate with the function to be tested, and said input to the function to be tested and said inverse input to the inverse of the function to be tested each comprise a plurality of instructions.

21. A program storage device readable by a machine, tangibly embodying a program of instructions executable by the machine to perform a method of verifying the design and functionality of electronic circuitry, said electronic circuitry comprising a function to be tested, said method comprising:

generating one or more in puts to the function to be tested and stimulating the electronic circuitry comprising the function to be tested, wherein the function to be tested generates an output corresponding to said one or more inputs;

generating one or more inverse inputs to the inverse of the function to be tested, said inverse inputs comprising the outputs, and stimulating electronic circuitry comprising the inverse of the function to be tested, wherein the inverse of the function to be tested generates an inverse output corresponding to said one or more inverse inputs; and generating an error notification when comparison of said inverse output of the inverse of the function to be tested and said input does not yield an expected result.

22. The program storage device of claim 21, wherein said one or more inputs to the function to be tested further comprises a pseudo-random numerical value.

23. The program storage device of claim 22, wherein the function to be tested comprises an arithmetic function, the inverse of the function to be tested comprises an inverse arithmetic function, said output of the function to be tested comprises the arithmetic combination of said input and a constant, said inverse output of the inverse of the function to be tested comprises the inverse arithmetic combination of said output of the function to be tested and said input, and said expected result comprises said constant.

24. The program storage device of claim 22, wherein the function to be tested comprises one or more operational functions, the inverse of the function to be tested comprises one or more complementary operational functions that operate with the function to be tested, and said one or more inputs to the function to be tested and said one or more inverse inputs to the inverse of the function to be tested each comprise an identical plurality of pseudo-random numerical values.

25. The program storage device of claim 21, wherein the function to be tested comprises one or more operational functions, the inverse of the function to be tested comprises one or more complementary operational functions that operate with the function to be tested, and said one or more inputs to the function to be tested and said one or more inverse inputs to the function to be tested each comprise a plurality of instructions.

* * * * *